United States Patent [19]

Krause

[11] Patent Number: 4,667,160

[45] Date of Patent: May 19, 1987

[54] HIGH FREQUENCY ANTENNA DEVICE IN NUCLEAR-SPIN TOMOGRAPHY APPARATUS AND METHOD FOR OPERATING SAME

[75] Inventor: Norbert Krause, Heroldsbach, Fed. Rep. of Germany

[73] Assignee: Siemens Aktiengesellschaft, Munich, Fed. Rep. of Germany

[21] Appl. No.: 713,553

[22] Filed: Mar. 19, 1985

[30] Foreign Application Priority Data

Mar. 20, 1984 [DE] Fed. Rep. of Germany ....... 3410215

[51] Int. Cl.$^4$ ............................................ G01R 33/20
[52] U.S. Cl. .................................... 324/318; 324/316; 333/227
[58] Field of Search ............... 324/318, 319, 316, 317, 324/300, 322; 333/219, 227, 230

[56] References Cited

U.S. PATENT DOCUMENTS

| | | | |
|---|---|---|---|
| 3,028,541 | 4/1962 | Bruma et al. | 324/316 |
| 4,310,799 | 1/1982 | Hutchinson et al. | 324/319 |
| 4,320,342 | 3/1982 | Heinzerling | 324/319 |
| 4,388,601 | 6/1983 | Sneed, Jr. et al. | 333/227 |
| 4,506,224 | 3/1985 | Krause | 324/319 |

FOREIGN PATENT DOCUMENTS

| 021535 | 1/1981 | European Pat. Off. | |
|---|---|---|---|
| 2530816 | 1/1984 | France | 128/653 |

OTHER PUBLICATIONS

B. D. Guenther et al., Capacitively and Inductively Foreshortened Cavities for Magnetic Resonance Spectroscopy, Rev. of Sci. Inst., vol. 42, No. 4, Apr., 71.
"Research Papers" Resolution and Signal–to–Noise Relationships in NMR Imaging in the Human Body, *J. Phys. E: Sci. Instrum.*, vol. 13, 1980, printed in Great Britain, J. M. Libove and J. R. Singer, May 2, 1979, pp. 38–44.

*Primary Examiner*—Stewart J. Levy
*Assistant Examiner*—Scott M. Oldham
*Attorney, Agent, or Firm*—Kenyon & Kenyon

[57] ABSTRACT

An antenna device for exciting a magnetic high-frequency field and/or for receiving corresponding high-frequency signals in a nuclear spin tomography apparatus contains a tubular antenna part which is designed to largely pass low frequencies, for magnetic gradient fields, consists of electrically highly conductive nonmagnetic material and has means for connecting to an external energy feeding or receiving device. In order to permit a simple design for this antenna device, only the tubular antenna part is provided as a circular waveguide for exciting or receiving the high frequency field. The circular waveguide is provided at least in the region of the cross-sectional plane extending through the center of its axial dimension with a system of coupling elements for coupling in or out the corresponding high-frequency power. In addition, further coupling systems may be provided in at least two cross-sectional planes symmetrical to the central cross-sectional plane.

20 Claims, 4 Drawing Figures

HIGH FREQUENCY ANTENNA DEVICE IN NUCLEAR-SPIN TOMOGRAPHY APPARATUS AND METHOD FOR OPERATING SAME

BACKGROUND OF THE INVENTION

This invention relates to nuclear spin tomography in general and more particularly to an antenna device for exciting an at least largely homogeneous magnetic high-frequency field and/or for receiving corresponding high-frequency signals in a nuclear spin tomography apparatus.

An antenna device for use in nuclear spin tomography, with a tubular antenna part which is designed at least largely so as to pass low-frequencies for magnetic gradient fields, and consists of an electrically highly conductive non-magnetic material of predetermined thickness and is connected to an external energy feed or receiving device is described in DE-OS No. 31 33 432.

In the field of medical diagnostics, image-forming methods have been developed in which by calculation or measurement, integral resonance signals of nuclei of a given element of a body to be examined are analyzed, particularly of a human body or part of a human body. From the spatial spin density and/or relaxation time distribution to be obtained in the manner, an image similar to the x-ray tomograph can be constructed. Suitable methods are known under the designation "nuclear spin tomography" (Nuclear Magnetic Resonace tomography) or "Zeugmatography".

A requirement in nuclear spin tomography is a strong magnetic field which is generated by a so-called base field magnet, is as homogeneous as possible in a region of predetermined extent and into which the body to be examined is placed along an axis which generally coincides with the orientation axis of the magnetic base field. Superimposed on this base field are stationary and/or pulsed, so-called gradient fields. For exciting the individual atomic nuclei in the body to perform a precession motion, a special antenna device is further required, by which means of a high-frequency magnetic alternating field (RF alternating field) can be excited for a short time and which can also be used for receiving the RF signals connected thereto if a separate measuring coil is not provided for this purpose.

As is well known, the quality of the sectional images in such apparatus for nuclear spin tomography (NMR tomography) depends on the signal-to-noise ratio of the induced nuclear spin resonance signal. Since this signal-to-noise ratio in turn depends on the strength of the magnetic base field and increases with frequency, it is desirable to provide frequencies as high as possible for high base fields (see "Jour. Phys. E: Sci. Instrum.", volume 13, 1980 pages 38 to 44).

With the known RF antenna device mentioned at the outset, RF fields with high frequencies of about 20 MHz or more can be excited and recieved. To this end, the antenna device contains a tubular antenna part of electrically highly conductive nonmagnetic material. This antenna part represents and envelope around several conductor sections which form at least one pair of conductors which are disposed on an imaginary cylinder surface, around which the envelope is arranged concentrically at predetermined spacings. On the at least one conductor pair and the envelope, wave propagation with very high frequency is then made possible, resonance conditions being adjusted in such a manner that fields oscillating in the same phase are developed in the entire volume of interest in the form of standing waves on the pair of conductors. Since furthermore the common envelope around the pair of conductors is designed so that is passes, at least largely, low frequencies, the low-frequency gradient fields can accordingly propagate unimpeded in the volume into which the body to be examined is to be placed.

It is an object of the present invention to simplify this known antenna device.

SUMMARY OF THE INVENTION

According to the present invention, this object is attained by providing only the tubular antenna part as a circular hollow conductor for exciting or for receiving the high-frequency field, where the circular hollow conductor is provided, at least in the region of the cross-sectional plane extending through the center of its axial extent, with a system of coupling elements for feeding-in and picking-up the corresponding high frequency power.

The advantages connected with this design of the antenna device are seen in particular in the fact that with such a circular waveguide, fields with frequencies far above 20 MHz can be excited and received in a relatively simple manner.

A method for operating the antenna device which contains, in at least two parallel cross-sectional planes which are symmetrical to the central cross-sectional plane and parallel thereto, a further coupling system, comprises according to the present invention setting the phase and amplitude conditions at the individual coupling systems by means of energy feed devices connected thereto in such a manner that the field strengths caused by these coupling systems are superimposed, forming a total field strength which is practically zero outside the region defined by the parallel cross-section planes of the two outer coupling systems arranged symmetrically to the central cross-sectional plane.

DETAILED DESCRIPTION

In the nuclear spin tomography apparatus for which the high frequency antenna device according to the present invention is provided, known apparatus for nuclear spin tomography is taken as the basis. Such apparatus is described, for instance, in European Pat. No. EP 21 535 Al or in DES-OS No. 28 40 178. It comprises in general at least one field coil system which is arranged concentrically relative to the z-axis of an x-y-z coordinate system in a normal or, in particular, superconducting manner by means of which a base field as homogeneous as possible is generated in the z direction. In addition, gradient coils for generating sufficiently constant magnetic field gradients are provided. The magnet coils permit axial access to the homogeneous field region at its center, i.e., access, in particular, for a human body or body part to be examined to be put in place into the magnetic field along the z-axis. The nuclear spin is excited by means of a high-frequency field which is as homogeneous as possible and is orientated perpendicular to the z-axis.

Figure 1:
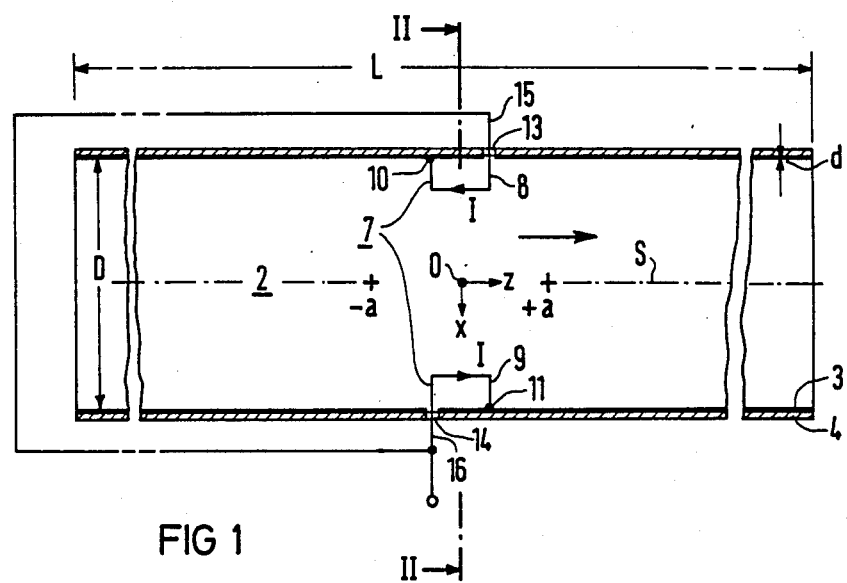
FIG. 1 is a longitudinal section of a high-frequency antenna device according to the present invention indicated schematically.
Figure 2:
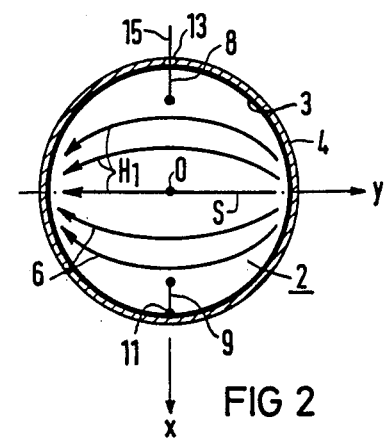
FIG. 2 is a transverse cross-section of the antenna of FIG. 1.

An embodiment of a high-frequency antenna device according to the present invention which can be used for this purpose is illustrated in FIG. 1 as a longitudinal section and in FIG. 2 as a transverse cross-section. Like parts are provided with the same reference symbols. The antenna device contains a hollow cylindrical circular waveguide 2, the cylinder axis of which is oriented in the direction of the z-axis of an orthogonal x-y-z coordinate system. The coordinate origin 0 is placed in the axial center of the circular waveguide 2. Circular waveguide 2 with an axial length L and a diameter D consists of an electrically highly conducting nonmagnetic material such as copper and may optionally be silver-plated at least on one side. The circular waveguide 2 is formed by a nonmetallic electrically insulating tubular support, to the outside or inside of which a thick copper foil or film is applied. According to the illustrated embodiment of FIGS. 1 and 2, the antenna itself is formed by a copper foil 3 with a diameter D on the inside of the support tube 4. Since the circular waveguide is to be permeable for the low-frequency gradient fields, the wall thickness d of its electrically conductive material must, on the one hand, be relatively small. On the other hand, however, the RF impedance of the waveguide is increased with decreasing thickness, for which reason the thickness d is advantageously chosen larger than the depth of penetration of the high-frequency field. In general, the thickness d is between 10 and 50 $\mu$m.

By means this circular waveguide 2, a high-frequency magnetic field $H_1$ is generated which is indicated by dashed lines 6 with arrows and is largely homogeneous at least in the central examination region about the coordinate origin (z=0) and is oriented perpendicular to the z-axis. For this purpose, the high-frequency energy or power is fed into the waveguide 2 by an energy feeding device, not shown in the figure, via a system 7 of coupling elements which extends at least in the region of the cross sectional plane extending through the coordinate origin (z=0) and is attached to the circular waveguide 2. The coupling system 7 consists of at least one pair of coupling elements 8 and 9 which are arranged diametrically to each other and extend symmetrically to the y-z plane S. These coupling elements of known design are disposed on the inside of the circular waveguide 2 in the shape of a bracket extending in the z-direction and are connected on one side to the electrically conducting waveguide wall 3 at points 10 and 11 (see, for instance, H. Meinke/F. W. Grundlach; Handbook of High-Frequency Engineering, Third Edition 1968, pages 462 to 465, especially FIG. 4.4). Its other end is brought insulated through the waveguide wall 3 and 4 at points 13 and 14 and is connected via coaxial cables 15 and 16 to the external energy feeding device. The leads 10 and 11, and thereby also the feed-throughs 13 and 14 are connected in such a manner that the flow directions indicated at the conductor bracket, of the currents I in the opposite coupling elements are opposed to each other as seen in the z-direction.

Figure 3:
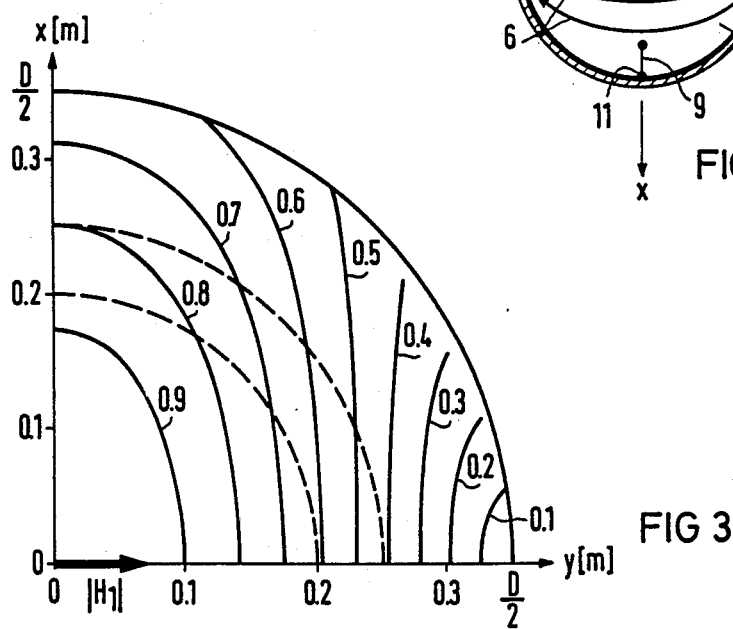
FIGS. 3 and 4 diagrams illustrating the field strength conditions which can be developed with the antenna of FIGS. 1 and 2.

According to the illustrated embodiment shown in FIGS. 1 and 2, the coupling system 7 comprises only two coupling elements 8 and 9. Optionally, however, the system may also be formed, on each side of the y-z symmetry plane S, not of one, but of several coupling elements through which the current flows in the same sense so that then a corresponding number of pairs is provided which are arranged diametrically opposed and through which current flows in opposite directions. Since the diameter D of the circular waveguide 2 is small relative to the wavelength of the high-frequency field of 20 MHz or higher, the circular waveguide can be operated in a so-called "cut-off" range mode below a given frequency limit. This involves a range of a periodic wave propagation (see the cited handbook, pages 313 to 316). If, therefore, high-frequency power is fed-in the plane z=0 of the waveguide extending from z=$-L/2$ to z=$L/2$, the magnetic RF field drops off toward positive and negative z according to a function exp$(-\alpha|z|)$ (see the cited handbook, page 309). Alpha is a numerical value, depending on the frequency, typical for the field condition in the waveguide, the so-called mode. Particularly advantageous for an application in nuclear spin tomography is operation in the so-called $H_{11}$ mode with a magnetic field $H_1$ transverse to the z-axis (see, for instance, the cited handbook, pages 332 to 334). In the diagram shown in FIG. 3, such a transversal plane xy is shown by lines of constant relative field strength of the magntidue $|H_1|$. A diameter of D of 0.7 m and a frequency f of 64 MHz were assumed. The field strength which was developed in the center (x=y=0) and points in the x-direction is to have a normalized magnitude $|H_1|=1$. The field strengths obtained thereby are entered at the individual lines. Drawn further by dashed lines are measurement volumes with a diameter of 0.4 and 0.5 m respectively, which are of special interest for apparatus for nuclear spin tomography.

Figure 4:
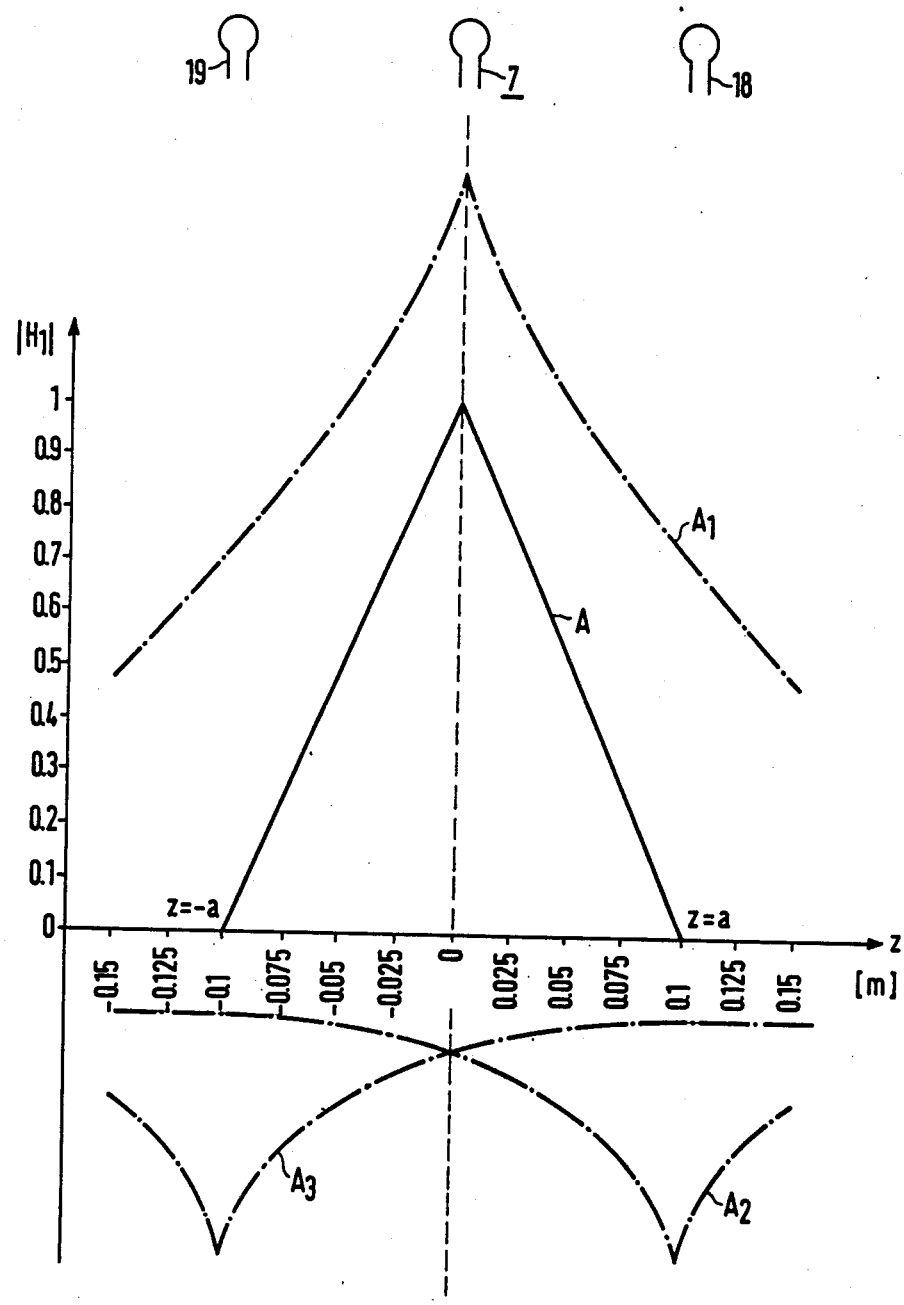

In accordance with the illustrated embodiment of FIGS. 1 and 2, it was assumed that excitation of the circular waveguide antenna takes place only in the transversal central plane (z=0) via a corresponding coupling system formed by the individual coupling elements. It is particularly advantageous, however, if the excitation takes place in several transverse planes, where similar coupling systems are provided which are disposed symmetrically to the transversal center plane (z=0). Thus, appropriate coupling systems can be provided particuarly in three transversal planes, via for instance coupling systems corresponding the coupling system 7 according to FIG. 1. The diagram shown in FIG. 4 is based on appropriate excitation. In this diagram, the magnitude of the relative field strength $H_1$ in the longitudinal direction of the waveguide is indicated as a function of the spatial position on the z-axis. The three coupling systmes 7, 18 and 19 indicated by a respective symbolic coupling element are to be arranged at z=0 (system 7) at z=a=0.1 m (system 18) and z=$-a$=$-0.1$ m (system 19). On the ordinate, the magntidue of $H_1$ is given in relative units with respect of the value normalized at 1 for z =0. If feeding into the individual coupling systems is accomplished with a defined phase and amplitude difference, an approximately linear field drop off from z=0 to the right and left can be set. This field curve shown by the solid curve A is obtained from a superposition of the field shapes generated by the individual coupling systems. The field pattern caused solely by the coupling system 7 is shown by a dash-dotted curve which is designated as $A_1$; the field pattern caused by the coupling system 18 by a dash-dotted curve designated as $A_2$; and the field pattern caused by the coupling system 19 by a dash-dotted curve designated as $A_3$. The field $H_1$ (curve A) is, therefore, practically zero for all z values with a magnitude z larger than a=0.1 m. I.e., the field is limited to a narrow transverse layer. In this manner, in particular, noise pick-up from parts of the body to be examined which does not fall into the measurement volume can advantageously be prevented.

What is claimed is:

1. An antenna device for coupling to a magnetic high-frequency field in a nucelar spin tomography apparatus, comprising:
   (a) a tubular antenna part, adapted at least largely so as to pass low frequencies for magnetic gradient fields, of an electrically highly conductive non-magnetic material of predetermined thickness, said tubular antenna part comprising a circular hollow waveguide for the high frequency field; and
   (b) a system of coupling elements for coupling high-frequency power in or out of said circular waveguide disposed at least in the region of the cross-sectional plane extending through the center of the axial dimension of said tubular part.

2. An antenna device according to claim 1, wherein said circular waveguide comprises a foil or layer of conductive material applied to the inside or to the outside of a carrier body consisting of electrically insulating material.

3. An antenna device according to claim 2, wherein the thickness of said foil or layer of the circular waveguide consisting of electrically conductive material is between 10 and 50 $\mu$m.

4. An antenna device according to claim 3, wherein said coupling system comprises at least one pair of coupling elements arranged on the inside of the circular waveguide and diametrically opposite each other.

5. An antenna device according to claim 4, wherein said coupling elements are in the form of brackets and have axially extending conductor parts which connect on the one side to the electrically conductive material of said circular waveguide in an electrically conducting manner.

6. An antenna device according to claim 5, wherein the connecting points of said coupling elements with the circular waveguide are arranged in such a manner that the flow directions of the current in the axially oriented conductor parts of said elements are opposed.

7. An antenna device according to claim 6, and further including a further coupling system disposed in at least two cross-sectional planes which are parallel and symmetrical to the central cross-sectional plane.

8. An antenna device according to claim 1, wherein said coupling system comprises at least one pair of coupling elements arranged on the inside of the circular waveguide and diametrically opposite each other.

9. An antenna device according to claim 8, wherein said coupling elements are in the form of brackets and have axially extending conductor parts which connect on the one side to the electrically conductive material of said circular waveguide in an electrically conducting manner.

10. An antenna device according to claim 9, wherein the connecting points of said coupling elements with the circular waveguide are arranged in such a manner that the flow directions of the current in the axially oriented conductor parts of said elements are opposed.

11. An antenna device according to claim 10, and further including a further coupling system disposed in at least two cross-sectional planes which are parallel and symmetrical to the central cross-sectional plane.

12. An antenna device according to claim 2, wherein said coupling system comprises at least one pair of coupling elements arranged on the inside of the circular waveguide and diametrically opposite each other.

13. An antenna device according to claim 12, wherein said coupling elements are in the form of brackets and have axially extending conductor parts which connect on the one side to the electrically conductive material of said circular waveguide in an electrically conducting manner.

14. An antenna device according to claim 13, wherein the connecting points of said coupling elements with the circular waveguide are arranged in such a manner that the flow directions of the current in the axially oriented conductor parts of said elements are opposed.

15. An antenna device according to claim 14, and further including a further coupling system disposed in at least two cross-sectional planes which are parallel and symmetrical to the central cross-sectional plane.

16. An antenna device according to claim 1, and further including a further coupling system disposed in at least two cross-sectional planes which are parallel and symmetrical to the central cross-sectional plane.

17. An antenna device according to claim 2, and further including a further coupling system disposed in at least two cross-sectional planes which are parallel and symmetrical to the central cross-sectional plane.

18. An antenna device according to claim 3, and further including a further coupling system disposed in at least two cross-sectional planes which are parallel and symmetrical to the central cross-sectional plane.

19. An antenna device according to claim 4, and further including a further coupling system disposed in at least two cross-sectional planes which are parallel and symmetrical to the central cross-sectional plane.

20. A method for operating an antenna device in nuclear spin tomography apparatus, which antenna device comprises a circular waveguide and three coupling systems for coupling energy to or from said waveguide, each coupling system comprising at least one pair of coupling elements diametrically opposed to each other, one coupling system disposed in the cross-sectional plane extending through the center of the axial dimension of the circular waveguide and the others in planes parallel and symmetrical to said center plan comprising:
   setting phase conditions and, amplitude conditions at the individual coupling systems by means of an energy feeding device connected thereto such that the field strengths caused by each of said coupling systems alone are superimposed to form a total field strength which is practically zero outside the region bounded by the parallel cross-sectional planes of the two outer coupling systems which are arranged symmetrically to the central cross sectional plane.

* * * * *